United States Patent
Yang et al.

(10) Patent No.: US 12,506,039 B2
(45) Date of Patent: Dec. 23, 2025

(54) FAILURE ANALYSIS AND LOCATION METHOD FOR SHORT CIRCUIT STRUCTURE

(71) Applicant: Shanghai Huali Integrated Circuit Corporation, Shanghai (CN)

(72) Inventors: Lingye Yang, Shanghai (CN); Jinde Gao, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 396 days.

(21) Appl. No.: 18/236,127

(22) Filed: Aug. 21, 2023

(65) Prior Publication Data

US 2024/0282648 A1 Aug. 22, 2024

(30) Foreign Application Priority Data

Feb. 21, 2023 (CN) .......................... 202310152460.5

(51) Int. Cl.
*H01L 21/66* (2006.01)
*G01R 31/265* (2006.01)
*G01R 31/52* (2020.01)

(52) U.S. Cl.
CPC .......... *H01L 22/34* (2013.01); *G01R 31/2656* (2013.01); *G01R 31/52* (2020.01)

(58) Field of Classification Search
CPC ...... G01R 31/265; G01R 31/52; G01R 31/26; G01R 31/2642; G01R 31/2656; G01R 31/307; H01L 21/66; H01L 22/14; H01L 22/30; H01L 22/34; H01L 22/12
See application file for complete search history.

(56) References Cited

U.S. PATENT DOCUMENTS

2020/0191859 A1* 6/2020 Yang .................. G01R 31/3004
2020/0191861 A1* 6/2020 Yang ...................... G01R 31/28

FOREIGN PATENT DOCUMENTS

CN 102446901 A * 5/2012 ........... H01L 23/544
CN 109698138 A * 4/2019 ........... H01L 23/522

OTHER PUBLICATIONS

English translation CN102446901A (Year: 2012).*
English translation CN109698138A (Year: 2019).*

* cited by examiner

*Primary Examiner* — Eman A Alkafawi
*Assistant Examiner* — Courtney G Mcdonnough
(74) *Attorney, Agent, or Firm* — Banner & Witcoff, Ltd.

(57) ABSTRACT

The present application provides a failure analysis and location method for a short circuit structure. a first layer metal wire structure and a second layer metal wire structure located above the first layer metal wire structure, the first and second layer metal wire structures are connected by a first layer metal via located between the first and second layer metal wire structures; a second layer metal via located above the second layer metal wire structure and connected to the second layer metal wire structure. A VC anomaly in the semiconductor structure is roughly located to find a failure region. The failure region is plated with a conductive material layer to connect the second layer metal via to the conductive material layer, wherein when an abnormal VC is found at a position on the cross-section of the sample, a failure point at the position is accurately located.

8 Claims, 2 Drawing Sheets

Step 1. A semiconductor structure is provided, the semiconductor structure including: a first layer metal wire structure and a second layer metal wire structure located above the first layer metal wire structure, wherein the first and second layer metal wire structures are connected by a first layer metal via located between the first and second layer metal wire structures; and a second layer metal via located above the second layer metal wire structure and connected to the second layer metal wire structure Step 2. A VC anomaly in the semiconductor structure is roughly located to find a failure region Step 3. The failure region is plated with a conductive material layer to connect the second layer metal via to the conductive material layer Step 4. Focused ion beam sample preparation is performed along the failure region to form a sample, and observation of a VC on a cross-section of the sample is performed, wherein when an abnormal VC is found at a position on the cross-section of the sample, a failure point at the position is accurately located Step 5. A morphology of the failure point is represented, and a failure mechanism is analyzed

FIG. 1

FAILURE ANALYSIS AND LOCATION METHOD FOR SHORT CIRCUIT STRUCTURE

CROSS-REFERENCE TO RELATED APPLICATIONS

This application claims priority to Chinese patent application No. 202310152460.5, filed on Feb. 21, 2023, the disclosure of which is incorporated herein by reference in its entirety.

TECHNICAL FIELD

The present application relates to semiconductor technologies, in particular to a failure analysis and location method for a short circuit structure.

BACKGROUND

Currently, failure location means for short-circuit structured semiconductors include optical beam induced resistance change (OBIRCH), optical beam induced resistance change (EBIRCH), and voltage contrast (VC).

In a practical failure analysis process, OBIRCH is usually used first to roughly locate a hot spot of a failed structure without damaging a chip, then the chip is ground to remove a layer, followed by using SEM VC to observe a sample surface for further location, and finally TEM sample preparation is performed for observation and analysis. However, accurately locating a weak defect by using the above conventional location and analysis method often cannot be achieved, thus affecting a success rate and efficiency of a failure analysis.

BRIEF SUMMARY

In view of the defect in the prior art mentioned above, the purpose of the present application is providing a failure analysis and location method for a short circuit structure, so as to solve the problem that accurately locating a weak defect by using a semiconductor failure location and analysis method in the prior art often cannot be achieved, thus affecting a success rate and efficiency of a failure analysis To achieve the above purpose and other related purposes, the present application provides a failure analysis and location method for a short circuit structure, at least including:
  step 1, providing a semiconductor structure, the semiconductor structure including: a first layer metal wire structure and a second layer metal wire structure located above the first layer metal wire structure, wherein the first and second layer metal wire structures are connected by a first layer metal via located between the first and second layer metal wire structures; and a second layer metal via located above the second layer metal wire structure and connected to the second layer metal wire structure;
  step 2, roughly locating a VC anomaly in the semiconductor structure to find a failure region;
  step 3, plating the failure region with a conductive material layer to connect the second layer metal via to the conductive material layer;
  step 4, performing focused ion beam sample preparation along the failure region to form a sample, and observing a VC on a cross-section of the sample, wherein when an abnormal VC is found at a position on the cross-section of the sample, a failure point at the position is accurately located; and
  step 5, representing a morphology of the failure point, and analyzing a failure mechanism.

In an example, the semiconductor structure in step 1 is a back-end-of-line metal interconnection structure of a device.

In an example, a gate structure of the device in step 1 is a strip structure; and a direction of a source-drain region is perpendicular to the strip structure.

In an example, a method of an optical beam induced resistance change is used to roughly locate the VC anomaly in the semiconductor structure in step 2.

In an example, the second layer metal via in step 3 is connected to the conductive material layer to increase an area of the conductive material layer.

In an example, the failure point in step 4 is a failure caused by a short circuit.

In an example, an area of the failure point in step 4 is 155 nm.

In an example, the morphology of the failure point is represented by means of a transmission optical microscope in step 5.

As stated above, the failure analysis and location method for a short circuit structure of the present application has the following beneficial effects: in the present application, a focused ion beam microscope is used to perform plating with the conductive material, and the short circuit position is accurately located by increasing the area of the conductive material to form a significant voltage contrast, thereby greatly improving the success rate and efficiency of the failure analysis.

BRIEF DESCRIPTION OF THE DRAWINGS

FIG. 1 illustrates a failure analysis and location method for a short circuit structure of the present application.

DETAILED DESCRIPTION OF THE DISCLOSURE

The implementations of the present application are described below via specific examples, and those skilled in the art could readily understand other advantages and effects of the present application from the contents disclosed in the description. The present application can also be implemented or applied using other different specific implementations, and various details in the description can also be modified or changed based on different viewpoints and applications without departing from the spirit of the present application.

Please refer to FIGS. 1-4. It should be noted that the drawings provided in the embodiments are only used to illustrate the basic concept of the present application in a schematic way, so the drawings only show the components related to the present application rather than being drawn according to the number, shape, and size of the components in actual implementations. The type, number, and proportion of various components can be changed randomly in the actual implementations, and the layout of the components may be more complicated.

The present application provides a failure analysis and location method for a short circuit structure. Referring to FIG. 1, FIG. 1 illustrates the failure analysis and location method for a short circuit structure of the present application. The method at least includes the following steps:

Step 1. A semiconductor structure is provided, the semiconductor structure including: a first layer metal wire structure and a second layer metal wire structure located above the first layer metal wire structure, wherein the first and second layer metal wire structures are connected by a first layer metal via located between the first and second layer metal wire structures; and a second layer metal via located above the second layer metal wire structure and connected to the second layer metal wire structure.

In this embodiment of the present application, the semiconductor structure in step 1 is a back-end-of-line metal interconnection structure of a device.

In this embodiment of the present application, a gate structure of the device in step 1 is a strip structure; and a direction of a source-drain region is perpendicular to the strip structure.

Figure 2:
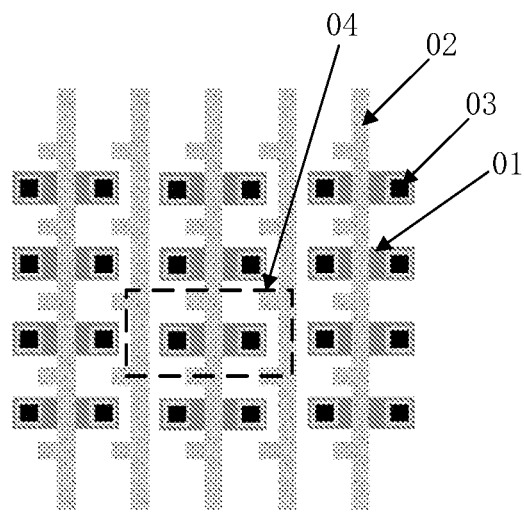
FIG. 2 illustrates a planar schematic diagram of a semiconductor structure of the present application.
Figure 4:
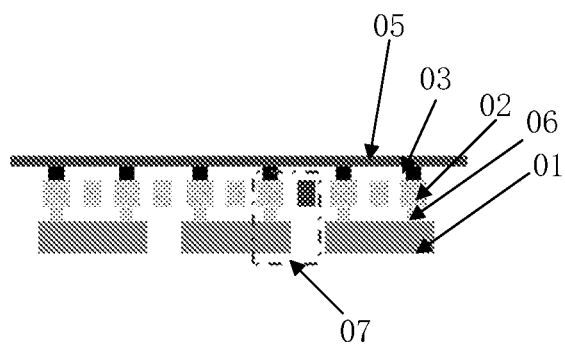
FIG. 4 illustrates a structural schematic diagram of a longitudinal section of the failure region plated with a conductive material of the semiconductor structure of the present application.

Referring to FIG. 2, FIG. 2 illustrates a planar schematic diagram of the semiconductor structure of the present application. The semiconductor structure is provided and includes the first layer metal wire structure 01 and the second layer metal wire structure 02 located above the first layer metal wire structure 01. Referring to FIG. 4, FIG. 4 illustrates a structural schematic diagram of a longitudinal section of a failure region plated with a conductive material of the semiconductor structure of the present application. The layer metal wire structure 01 and the second layer metal wire structure 02 are connected by the first layer metal via 06 located between the first and second layer metal wire structures. The second layer metal via 03 is located above the second layer metal wire structure 02 and connected to the second layer metal wire structure 02. The gate structure of the device is a strip structure; and the direction of the source-drain region is perpendicular to the strip structure. That is, the semiconductor structure in this embodiment is a back-end-of-line metal interconnection structure of a fin transistor (FInFET). The semiconductor structure includes a back-end-of-line metal interconnection structure of the device obtained by means of advanced processes, the advanced processes including processes of and below 7 nm. In other embodiments, the semiconductor structure further includes a back-end-of-line metal interconnection structure of the device obtained by means of processes other than the processes of and below 7 nm.

Step 2. A VC anomaly in the semiconductor structure is roughly located to find a failure region.

In this embodiment of the present application, a method of an optical beam induced resistance change is used to roughly locate the VC anomaly in the semiconductor structure in step 2.

Referring to FIG. 2, in step 2, the voltage contrast (VC) anomaly in the semiconductor structure is roughly located to find the failure region 04. In this embodiment, the method of the optical beam induced resistance change (OBIRCH) is used to roughly locate the voltage contrast (VC) anomaly in the semiconductor structure in step 2.

Step 3. The failure region is plated with a conductive material layer to connect the second layer metal via to the conductive material layer.

In this embodiment of the present application, the second layer metal via in step 3 is connected to the conductive material layer to increase an area of the conductive material layer.

Figure 3:
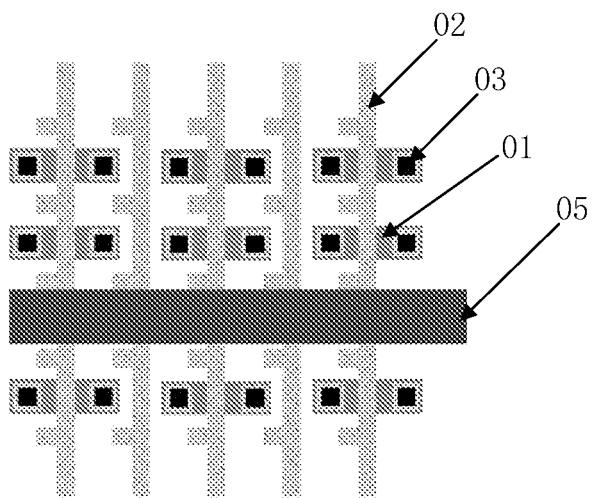
FIG. 3 illustrates a structural schematic diagram of a failure region plated with a conductive material layer of the present application.

Referring to FIG. 3, FIG. 3 illustrates a structural schematic diagram of the failure region plated with the conductive material layer of the present application. In step 3, the failure region is plated with the conductive material layer 05 to connect the second layer metal via 03 to the conductive material layer 05. In this embodiment, the second layer metal via 03 in step 3 is connected to the conductive material layer 05 to increase the area of the conductive material layer 05.

Step 4. Focused ion beam sample preparation is performed along the failure region to form a sample, and observation of a VC on a cross-section of the sample is performed, wherein when an abnormal VC is found at a position on the cross-section of the sample, a failure point at the position is accurately located.

In this embodiment of the present application, the failure point in step 4 is a failure caused by a short circuit.

In this embodiment of the present application, an area of the failure point in step 4 is 155 nm.

Referring to FIG. 4, FIG. 4 illustrates the structural schematic diagram of the longitudinal section of the failure region plated with the conductive material of the semiconductor structure of the present application. In step 4, the focused ion beam sample preparation is performed along the failure region to form the sample, and the observation of the VC on the cross-section of the sample is performed. When the abnormal VC is found at the position on the cross-section of the sample, the failure point 07 at that position is accurately located. The failure point is a failure caused by a short circuit. the area of the failure point is 155 nm Step 5. A morphology of the failure point is represented, and a failure mechanism is analyzed.

In this embodiment of the present application, the morphology of the failure point is represented by means of a transmission optical microscope in step 5.

To sum up, in the present application, a focused ion beam microscope is used to perform plating with the conductive material, and the short circuit position is accurately located by increasing the area of the conductive material to form a significant voltage contrast, thereby greatly improving the success rate and efficiency of the failure analysis. Therefore, the present application effectively overcomes various defects in the prior art and has high industrial utilization value.

The above embodiments merely illustrate the principle and effect of the present application, rather than limiting the present application. Anyone skilled in the art can modify or change the above embodiments without departing from the spirit and scope of the present application. Therefore, all equivalent modifications or changes made by those with ordinary knowledge in the art without departing from the spirit and technical idea disclosed in the present application shall still be covered by the claims of the present application.

What is claimed is:

1. A failure analysis and location method for a short circuit structure, at least comprising:
    step 1, providing a semiconductor structure, the semiconductor structure comprising: a first layer metal wire structure and a second layer metal wire structure located above the first layer metal wire structure, wherein the first layer metal wire structure and the second layer metal wire structure are connected by a first layer metal via located between the first layer metal wire structure and the second layer metal wire structure; and a second layer metal via located above the second layer metal wire structure and connected to the second layer metal wire structure;

step 2, roughly locating a voltage contrast (VC) anomaly in the semiconductor structure to find a failure region;

step 3, plating the failure region with a conductive material layer to connect the second layer metal via to the conductive material layer;

step 4, performing focused ion beam sample preparation along the failure region to form a sample, and observing a VC on a cross-section of the sample, wherein when an abnormal VC is found at a position on the cross-section of the sample, a failure point at the position is accurately located; and step 5, representing a morphology of the failure point, and analyzing a failure mechanism.

2. The failure analysis and location method for the short circuit structure according to claim 1, wherein the semiconductor structure in step 1 is a back-end-of-line metal interconnection structure of a device.

3. The failure analysis and location method for the short circuit structure according to claim 2, wherein a gate structure of the device in step 1 is a strip structure; and a direction of a source-drain region is perpendicular to the strip structure.

4. The failure analysis and location method for the short circuit structure according to claim 1, wherein a method of an optical beam induced resistance change is used to roughly locate the VC anomaly in the semiconductor structure in step 2.

5. The failure analysis and location method for the short circuit structure according to claim 1, wherein the second layer metal via in step 3 is connected to the conductive material layer to increase an area of the conductive material layer.

6. The failure analysis and location method for the short circuit structure according to claim 1, wherein the failure point in step 4 is a failure caused by a short circuit.

7. The failure analysis and location method for the short circuit structure according to claim 1, wherein an area of the failure point in step 4 is 155 nm.

8. The failure analysis and location method for the short circuit structure according to claim 1, wherein the morphology of the failure point is represented by means of a transmission optical microscope in step 5.

* * * * *